United States Patent
Higuchi et al.

(10) Patent No.: US 6,500,483 B1
(45) Date of Patent: Dec. 31, 2002

(54) METHOD AND DEVICE FOR APPLYING SEALANT TO COMPONENT

(75) Inventors: Masato Higuchi, Kusatsu (JP); Atsushi Hirakawa, Kanazawa (JP); Michinobu Maesaka, Omihachiman (JP)

(73) Assignee: Murata Manufacturing Co. (JP)

( * ) Notice: Subject to any disclaimer, the term of this patent is extended or adjusted under 35 U.S.C. 154(b) by 0 days.

(21) Appl. No.: 09/512,508

(22) Filed: Feb. 24, 2000

(30) Foreign Application Priority Data

Mar. 8, 1999 (JP) .......................................... 11-059601

(51) Int. Cl.⁷ .............................. B05D 5/12; B05D 1/18; B05C 3/20; H01G 4/252; H01C 17/28
(52) U.S. Cl. ...................... 427/96; 427/284; 427/430.1; 156/230; 156/356; 156/578; 118/264; 118/268; 118/400; 118/428; 401/283; 401/284; 239/53; 239/55
(58) Field of Search ................... 156/230, 240, 156/241, 247, 344, 356, 578, 242; 427/96, 207.1, 208.6, 208.4, 282, 480.1, 284; 118/259, 266, 261, 262, 264, 268, 400, 401, 415, 428; 401/270, 283, 284, 288; 239/44, 47, 48, 53, 55, 56

(56) References Cited

U.S. PATENT DOCUMENTS

| | | | | |
|---|---|---|---|---|
| 830,049 A | * | 9/1906 | Brickett | ...................... 118/268 |
| 875,546 A | * | 12/1907 | Metzner | ...................... 118/265 |
| 1,173,085 A | * | 2/1916 | Beeching | ...................... 118/265 |
| 3,145,121 A | * | 8/1964 | Kraft et al. | ...................... 118/202 |
| 4,394,844 A | * | 7/1983 | Wood et al. | .................. 118/260 |
| 4,589,950 A | * | 5/1986 | Sekavec, Jr. | ................. 156/578 |
| 6,136,128 A | * | 10/2000 | Chung | .......................... 156/235 |

FOREIGN PATENT DOCUMENTS

| | | | | |
|---|---|---|---|---|
| DE | 19908625 A1 | | 8/2000 | |
| JP | 02-033908 | * | 2/1990 | ............ H01G/1/14 |
| JP | 02-073608 | * | 3/1990 | ............ H01C/17/06 |
| JP | 4-105301 | | 4/1992 | |
| JP | 08-130170 | * | 5/1996 | ........... H01G/13/00 |

OTHER PUBLICATIONS

Japanese Office Action dated Jul. 23, 2002 (w/ English translation of revelant portion).

* cited by examiner

Primary Examiner—Jerry A. Lorengo
(74) Attorney, Agent, or Firm—Dickstein, Shapiro, Morin & Oshinsky, LLP

(57) ABSTRACT

A method for applying a sealant to a component, in which the sealant is applied to a part of or the entirety of a sealing surface of the component, comprises the steps of: disposing in the sealant, an abutting member approximately in parallel to a surface of the sealant, which is a liquid, formed into a film of a specified thickness; pressing the sealing surface of the component to the abutting member in the sealant formed into the film; and transferring the sealant to the sealing surface of the component by pulling the component apart from the sealant.

12 Claims, 3 Drawing Sheets

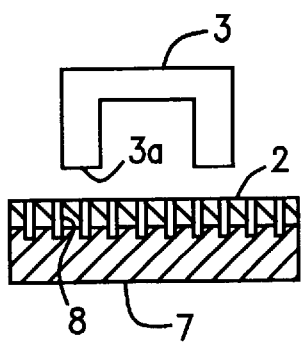
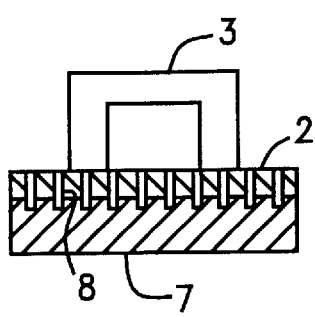
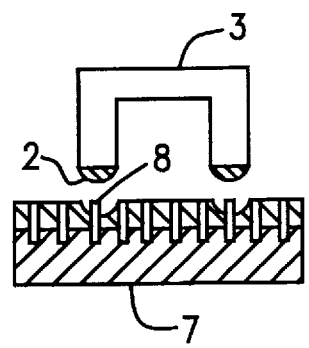
*FIG. 3A*  *FIG. 3B*  *FIG. 3C*
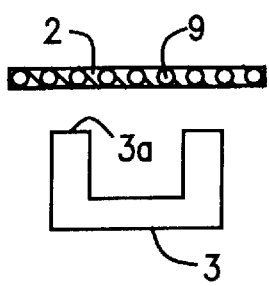
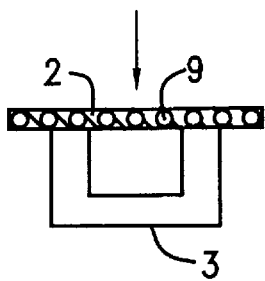
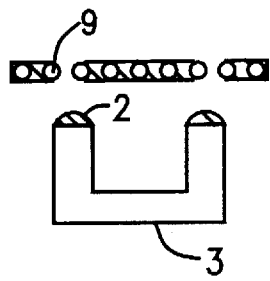
*FIG. 4A*  *FIG. 4B*  *FIG. 4C*

METHOD AND DEVICE FOR APPLYING SEALANT TO COMPONENT

BACKGROUND OF THE INVENTION

1. Field of the Invention

The present invention relates to methods and devices for applying a sealant to components which is used when a package of an electronic component is bonded.

2. Description of the Related Art

The package of an electronic component requires air-tight sealing to prevent the entry of moisture, flux, and the like, which may impair the function of an internal element. Thus, in general, a sealant such as an adhesive or solder is evenly applied to a sealing part of a package. After that, air-tightness is achieved by hardening or heat-fusion sealing.

As a method for applying a sealant to the package of an electronic component, a method for directly transferring the sealant to a sealing surface is mainly used. As shown in FIGS. 1A to 1C, this is a method in which a liquid sealant 2 of a film of a specified thickness is formed on an application base 1, and a sealing surface 3a of a component (a cap in this case) 3 is pressed on the sealant 2 to apply the sealant 2 to the entirety of the sealing surface 3a. The direct transferring method has advantages such as being achieved by a simple device, being capable of easily applying the sealant to the entire sealing surface 3a and being capable of simultaneously applying the sealant to a plurality of components 3, which leads to high productive efficiency.

However, in the case of the direct transferring method, the sealant is prone to extend onto the side surfaces of the component 3, as shown in FIG. 1C, by which there is a problem in that only a small amount of sealant 2 can adhere on the surface 3a used for sealing. In addition, the amount of the sealant applied tends to be uneven. As a result, sealing failure due to a local insufficiency of the sealant 2, contamination of a tool due to the sealant 2 adhered on the side surfaces, and dimensional inaccuracy tend to occur.

SUMMARY OF THE INVENTION

The present invention cam solve the problem associated with the conventional art and provide a method for applying a sealant to a component, in which the sealant can be evenly applied to a sealing surface of the component without extending onto the other surfaces, and a device therefor.

The method for applying a sealant to a component in which the sealant is applied to a part or the entirety of a sealing surface of the component includes the step of disposing an abutting member approximately in parallel to a surface of the sealant in a sealant liquid formed into a film of a specified thickness, the step of pressing the sealing surface of the component, to the abutting member disposed in the sealant formed into a film, and the step of transferring the sealant to the sealing surface of the component by pulling the component apart from the sealant.

The device for applying a sealant to a sealing surface of a component has an application base, a liquid sealant film of a specified thickness disposed on the application base, and an abutting member disposed approximately in parallel to a surface of the sealant in the sealant. The sealant is transferred onto the sealing surface of the component by pulling the sealing surface apart from the abutting member after pressing the sealing surface thereto.

The abutting member is disposed on the application base, and a film of the sealant having a specified thickness is formed in such a manner that the surface of the sealant is approximately in parallel to the surface of the abutting member. Next, the sealing surface of the component is pressed to the abutting member, and at the same time, is contacted with the sealant. With this arrangement, sinking of the sealing surface can be prevented. As a result, the sealant existing on the top surface of the abutting member or a gap between a plurality of abutting members adheres to the sealing surface of the component. Next, when the component is pulled apart from the sealant, the sealant adhered on the sealing surface is also pulled apart with the component, and the sealant is thereby transferred.

Regarding the sealant transferred in the way described above, since sinking of the component can be prevented by the abutting member, only a small amount of the sealant extends onto the side surfaces of the component, in contrast with a conventional method, and a large amount of the sealant can adhere on the sealing surface. Furthermore, since the amount of the sealant adhered on the sealing surface is even, the problem of sealing failure can be solved.

As the above abutting member, it is preferable to use a meshed member. In other words, in the case of the meshed member, since it has a planar form in which a series of meshed holes are regularly aligned, evenness of the amount of the sealant adhered on the sealing surface can be achieved.

In addition, the abutting member may be a plurality of small bumps protruding upwardly distributed on the application base. In this case, similarly, sinking of the component can be prevented by the top surfaces of the small bumps, and a large amount of the sealant can be applied to the sealing surface by filling the sealant in a gap between the small bumps.

Furthermore, the abutting member is not restricted to a meshed member or a small bump. Any type of member, for example, a porous plate, can be used as long as the member has a structure that prevents the component from sinking and inhibits the sealant from adhering onto the sealing surface of the component.

Preferably, the sealant application method according to the present invention is used in a case in which an adhesive such as an epoxy adhesive is applied to the sealing surface of a component, since the adhesive can be evenly applied to the sealing surface.

In addition, the method of the present invention can be used not only for the method in which a film of a sealant is formed on an application base and a component is pressed from above, but for a method in which a sealant is filled in a thick meshed member or a porous plate to dispose the meshed member or the porous plate flush against the component so as to transfer the sealant.

For the purpose of illustrating the invention, there is shown in the drawings several forms which are presently preferred, it being understood, however, that the invention is not limited to the precise arrangements and instrumentalities shown.

BRIEF DESCRIPTION OF THE DRAWINGS

FIGS. 3A to 3C show the views of a process illustrating a sealant applying method according to a second embodiment of the present invention.

FIGS. 4A to 4C show the views of a process illustrating a sealant applying method according to a third embodiment of the present invention.

FIGS. 5A to 5C show the views of a process illustrating a sealant applying method according to a fourth embodiment of the

DETAILED DESCRIPTION OF EMBODIMENTS OF THE INVENTION

Hereinafter, the preferred embodiments of the present invention are explained in detail with reference to the drawings.

Figure 1A:
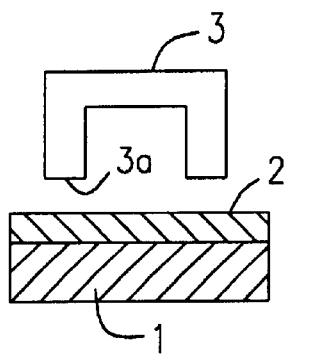
FIGS. 1A to 1C show the views of a process illustrating a conventional sealant-transferring method.
Figure 1B:
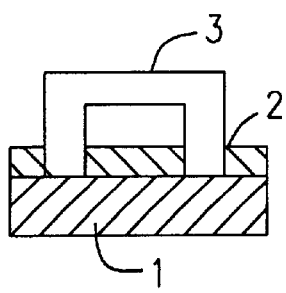
Figure 1C:
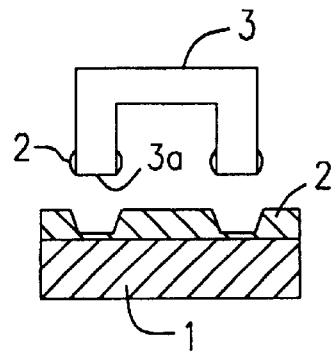

FIGS. 2A to 2D illustrate a sealant application method according to a first embodiment of the present invention. The same reference numbers are given to the same parts in the figure as those shown in FIGS. 1A to 1C and explanation thereof is omitted.

An application base 1 has a horizontal surface. On the upper part thereof, a mesh screen 4 is disposed in parallel with a specified tension at a distance of approximately 0.05 to 5.0 mm. A sealant 2 is applied to the application base 1, and squeezing is performed so that an evenly-thick film of the sealant 2 is produced in the area between the mesh screen 4 and the application base 1 (See FIG. 2A).

Figure 2A:
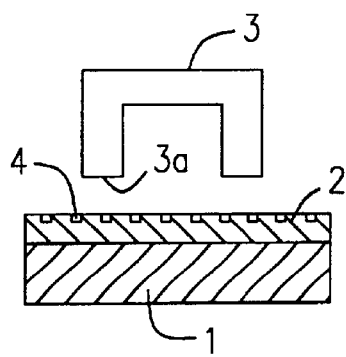
FIGS. 2A to 2D show the views of a process illustrating a sealant applying method according to a first embodiment of the present invention.
Figure 2B:
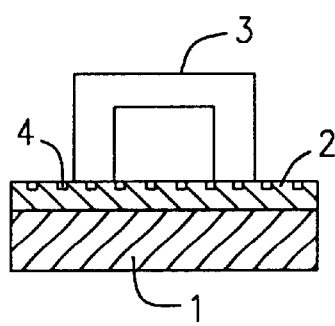

Next, a cap 3 of an electronic component is pressed against the mesh screen 4 in such a manner that an opening end face (a sealing surface) 3a of the cap 3 is oriented downwardly (See FIG. 2B). In this situation, the mesh screen 4 prevents the cap 3 from sinking, and the sealant 2 adheres on the opening end surface (rim) 3a of the cap 3 via the meshes of the screens 4. As a result, extension of the sealant 2 onto the side surfaces of the cap 3 can be prevented.

Figure 2C:
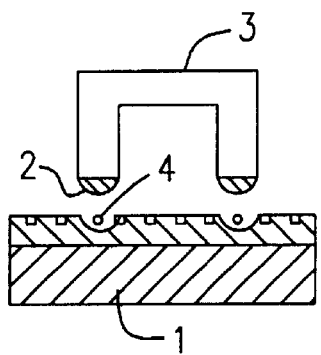

Next, when the cap 3 is withdrawn, the sealant 2 adhered onto the opening end face 3a is pulled with the cap 3, by which a specified amount of the sealant 2 is transferred (See FIG. 2C). In this case, since the opening end face 3a does not closely contact with the application base 1, a relatively large amount of the sealant 2 adheres onto the opening end face 3a.

Figure 2D:
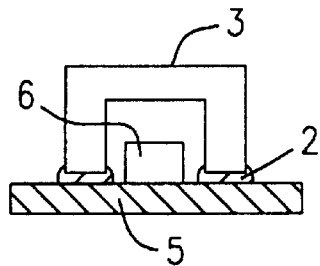

After this, the opening end face 3a of the cap 3 is bonded to a substrate 5 to form a package of the electronic component (See FIG. 2D). With this arrangement, an internal element 6 mounted on the substrate 5 is sealed air-tightly. Since there is almost no extension (protrusion) of the sealant 2 onto the side surfaces of the cap 3, failures such as dimensional inaccuracy of the package and adherence of the sealant to the internal elements 6 do not occur. In addition, since the contamination of a tool used when the sealant 2 hardens is minimized, the longevity of the tool can be increased.

Either metal or resin can be used as the material of the mesh screen 4. The fineness of meshes changes depending on the viscosity of the sealant 2 as an object used and the amount of the sealant 2 applied. It may be approximately 50 to 600 mesh, and preferably, it is approximately 100 to 250 mesh. In addition, the diameter of a line member used for meshes is preferably in a range of approximately 20 to 150 $\mu$m. When the viscosity of the sealant 2 is in a range of approximately 1 to 100 Pa·s, a satisfactory result can be obtained.

Although this is an example in which the surface of the mesh screen 4 is positioned at the same level as that of the surface of the sealant 2, it is also possible to cover the mesh screen 4 with the sealant 2 of a fixed thickness when necessary.

Table 1 shows the results of leakage tests on a package produced by the method of the present invention (See FIG. 2) and a package produced by the conventional method (See FIG. 1).

TABLE 1

| | SEALING FAILURE RATE (%) | |
|---|---|---|
| | PRESENT INVENTION | CONVENTIONAL ART |
| SAMPLE 1 (NO STEP) | 0.05 | 0.8 |
| SAMPLE 2 (WITH STEP) | 0.08 | 2.5 |

In Table 1, the sample 1 uses a cap with no step at the opening end face 3a, and the sample 2 uses a cap with a step of 25 $\mu$m at opening end face 3a.

As is evident from Table 1, since the sealant 2 is evenly applied to the entirety of the sealing surface (the opening end face 3a)in the method of the present invention, the sealing failure rate is significantly lower than that of the conventional method. In addition, even though there is, more or less, a step on the sealing surface 3a, as shown in the sample 2, the amount of the sealant 2 applied to the sealing surface in the present invention is larger than that in the conventional method. As a result, a high sealing rate on a product can be obtained in the method of the present invention.

FIGS. 3A to 3C illustrate a method according to a second embodiment of the present invention.

In this embodiment, an application base 7, on which many small bumps 8, which are upwardly protruding, are distributed as abutting members, is used. A sealant 2 is filled in a gap between the small bumps 8. The size of the small bumps 8 and the pitch therebetween are set to be smaller than the width of the sealing surface 3a to which the sealant 2 is applied.

First, the sealant 2 is applied onto the application base 7 and squeezing is performed so as to form a film of the sealant 2 in such a manner that a surface of the sealant 2 is positioned approximately at the same level as the top surfaces of the small bumps 8 (See FIG. 3A).

Next, when the opening end face 3a of a cap 3 is oriented downwardly to be pressed against the small bumps 8, the top surfaces of the small bumps 8 prevent the cap 3 from sinking (See FIG. 3B). With this arrangement, since the sealant 2 filled in the gap between the small bumps 8 adheres onto the opening end face 3a of the cap 3, extension of the sealant 2 onto the side surfaces can be prevented.

Next, when the cap is withdrawn, the sealant 2 adhered onto the opening end face 3a is pulled with the cap 3, As a result, a specified amount of the sealant 2 is transferred (See FIG. 3C). In this case, similarly, since the opening end face 3a does not closely contact with the application base 1, a large amount of the sealant 2 adheres onto the opening end face 3a.

FIGS. 4A to 4C illustrate a method of a third embodiment according to the present invention.

In this embodiment, a thick meshed member 9 or a porous plate is used as an abutting member. A sealant 2 is filled in the meshed member 9. The surface tension of the sealant 2 prevents dripping of the sealant 2 from the meshed member 9. In addition, an opening end face 3a of a cap 3 is upwardly oriented and the meshed member 9 is pressed against the opening end face 3a so that the sealant 2 is transferred.

In this case, as in the cases of the first and second embodiments, while preventing the sealant 2 from extending onto the side surfaces of the cap 3, an appropriate amount of the sealant 2 can be applied to the opening end face 3*a*.

Figure 5A:
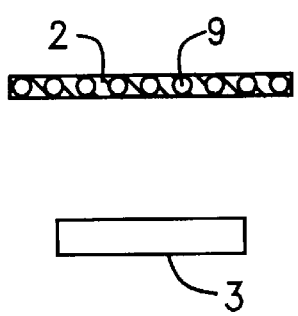
Figure 5B:
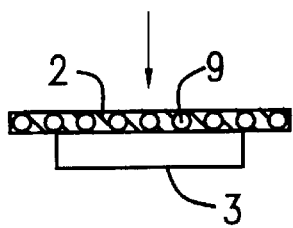
Figure 5C:
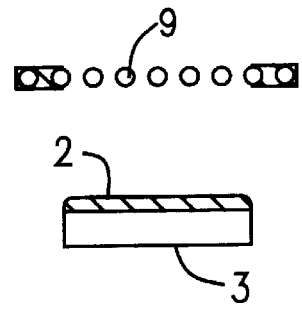

FIGS. 5A to 5C illustrate a method according to a fourth embodiment of the present invention.

In this embodiment, the meshed member 9 or the porous plate described in the third embodiment is used. A sealant 2 is transferred to the entirety of a surface of a plate 3 such as a cap member. In this case, the sealant 2 of approximately even thickness can be applied with no extension onto the side surfaces of the plate 3.

Furthermore, the present invention is not restricted to the above-described embodiment. Various modifications can be applied without departing from the spirit and scope of the invention.

As a sealant used in the present invention, besides an adhesive, a flexible material such as solder and silicone rubber may be used, as long as it has a liquid form when applied.

As an abutting member used in the present invention, besides the mesh screen, the application base having many small bumps, and the thick meshed material, which are used in the embodiments, it is also possible to use a material having gaps for filling a sealant and capable of preventing the sinking of a component when pressed, such as a porous plate or the like. Thus, the material of the member may be, besides metal or resin, a hard rubber, a hard sponge, a ceramic, or the like.

A component to apply a sealant is not restricted to a cap, a substrate, a case, and a cover for forming a package, and any type of component can be used. In addition, the configuration of the sealing surface can be modified, and any configuration, such as a configuration of bumps and dips, a planar configuration, or a cylindrical configuration, can be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for applying a sealant to a component, in which the sealant is applied to a part of or the entirety of a sealing surface of the component, comprising the steps of:

providing an application base and a spaced apart abutting member parallel thereto;

applying a liquid sealant to the application base and forming a film of the liquid sealant in the area between the application base and the abutting member and to dispose the abutting member in the liquid sealant film approximately in parallel to a surface of the sealant;

pressing the sealing surface of the component to the abutting member in the sealant film without contacting the sealing surface of the component with the application base; and transferring the sealant to the sealing surface of the component by pulling the component apart from the sealant.

2. A method for applying a sealant to a component according to claim 1, wherein the abutting member is disposed within the sealant film approximately 0.05 to 5 mm from the surface thereof.

3. A method for applying a sealant to a component according to claim 1, wherein the thickness of the abutting member and the sealant film are such that the sealant film extends to approximately the same level as the surface of the abutting member to which the component is pressed.

4. A method for applying a sealant to a component according to claim 1, wherein the abutting member comprises a meshed member.

5. A method for applying a sealant to a component according to claim 2, wherein the abutting member comprises a meshed member.

6. A method for applying a sealant to a component according to claim 5, wherein the thickness of the abutting member and the sealant film are approximately the same, whereby the sealant film extends to approximately the same level as the surface of the abutting member to which the component is pressed.

7. A method for applying a sealant to a component according to claim 6, wherein the component is part of an electronic component package.

8. A method for applying a sealant to a component according to claim 7, wherein the sealing surface of the component is stepped.

9. A method for applying a sealant to a component according to claim 1, wherein the abutting member is separated from the application base and sealant film thereon other than that in which the abutting member is disposed before the sealing surface of the component is pressed to the abutting member.

10. A method for applying a sealant to a component according to claim 9, wherein the abutting member is a meshed member.

11. A method for applying a sealant to a component according to claim 10, wherein the component is part of an electronic component package.

12. A method for applying a sealant to a component according to claim 11, wherein the sealing surface of the component is stepped.

* * * * *